(12) United States Patent
Tanaka et al.

(10) Patent No.: US 9,634,796 B2
(45) Date of Patent: Apr. 25, 2017

(54) OPTICAL TRANSMISSION DEVICE AND OPTICAL TRANSMISSION SYSTEM

(71) Applicant: FUJITSU LIMITED, Kawasaki-shi, Kanagawa (JP)

(72) Inventors: Toshiki Tanaka, Setagaya (JP); Tomoo Takahara, Kawasaki (JP); Masato Nishihara, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 138 days.

(21) Appl. No.: 14/618,002

(22) Filed: Feb. 10, 2015

(65) Prior Publication Data

US 2015/0256288 A1 Sep. 10, 2015

(30) Foreign Application Priority Data

Mar. 7, 2014 (JP) ................................ 2014-045183

(51) Int. Cl.
*H03M 13/00* (2006.01)
*H04L 1/00* (2006.01)
(Continued)

(52) U.S. Cl.
CPC .......... *H04L 1/004* (2013.01); *H03M 13/353* (2013.01); *H04B 10/516* (2013.01);
(Continued)

(58) Field of Classification Search
CPC . H04B 10/516; H04B 10/5167; H03M 13/04; H03M 13/044; H03M 13/03;
(Continued)

(56) References Cited

U.S. PATENT DOCUMENTS

| 5,479,447 A | 12/1995 | Chow et al. |
| 5,839,077 A | 11/1998 | Kowaguchi |

(Continued)

FOREIGN PATENT DOCUMENTS

| EP | 1372304 A2 | 12/2003 |
| EP | 2228933 A1 | 9/2010 |

(Continued)

OTHER PUBLICATIONS

Qi Yang, et al., Optical OFDM basic, Chapter 2, 2011, Springer, pp. 43 to 85 (retrived from google.com Aug. 19, 2016).*

(Continued)

*Primary Examiner* — Shelly A Chase
(74) *Attorney, Agent, or Firm* — Fujitsu Patent Center

(57) ABSTRACT

An optical transmission device includes an error correction scheme determining unit, an error correction encoder, a modulation format determining unit and an optical transmitter. The error correction scheme determining unit determines an error correction scheme based on a latency between the optical transmission device and a correspondent device. The error correction encoder generates encoded data by performing an error correction encoding on transmission data using the error correction scheme determined by the error correction scheme determining unit. The modulation format determining unit determines a modulation format based on the error correction scheme determined by the error correction scheme determining unit and transmission characteristics between the optical transmission device and the correspondent device. The optical transmitter generates a modulated optical signal from the encoded data with the modulation format determined by the modulation format determining unit.

10 Claims, 12 Drawing Sheets

(51) Int. Cl.
*H03M 13/35* (2006.01)
*H04B 10/516* (2013.01)

(52) U.S. Cl.
CPC .......... *H04L 1/0003* (2013.01); *H04L 1/0005* (2013.01); *H04L 1/0009* (2013.01); *H04L 1/0011* (2013.01); *H04L 1/0018* (2013.01); *H04L 1/0022* (2013.01)

(58) Field of Classification Search
CPC .. H03M 13/353; H04L 1/1004; H04L 1/0018; H04L 1/0009; H04L 1/0022; H04L 1/0011; H04L 1/0003
See application file for complete search history.

(56) References Cited

U.S. PATENT DOCUMENTS

| | | | | |
|---|---|---|---|---|
| 7,515,832 | B2* | 4/2009 | Kikuchi | H04B 10/5051 398/102 |
| 8,433,202 | B2* | 4/2013 | Way | H04B 10/5167 398/154 |
| 2007/0291829 | A1 | 12/2007 | Nabetani et al. | |
| 2013/0007553 | A1 | 1/2013 | Nishida et al. | |
| 2013/0195442 | A1* | 8/2013 | Murakami | H04B 10/0795 398/25 |

FOREIGN PATENT DOCUMENTS

| | | |
|---|---|---|
| JP | H3-71739 | 3/1991 |
| JP | H9-116486 | 5/1997 |
| JP | 2013-13030 | 1/2013 |
| WO | 03/049376 A1 | 6/2003 |

OTHER PUBLICATIONS

Shukkla et al., Adaptively modulated optical fiber link in IM-DD systems, Feb. 2012, ISOR Journal of Engineering vol. 2, Issue 2, pp. 331 to 337 (retrieved from google.come Aug. 19, 2016).*

EESR—The Extended European Search Report issued on Jul. 21, 2015 for corresponding European Patent Application No. 15154450.9.

* cited by examiner

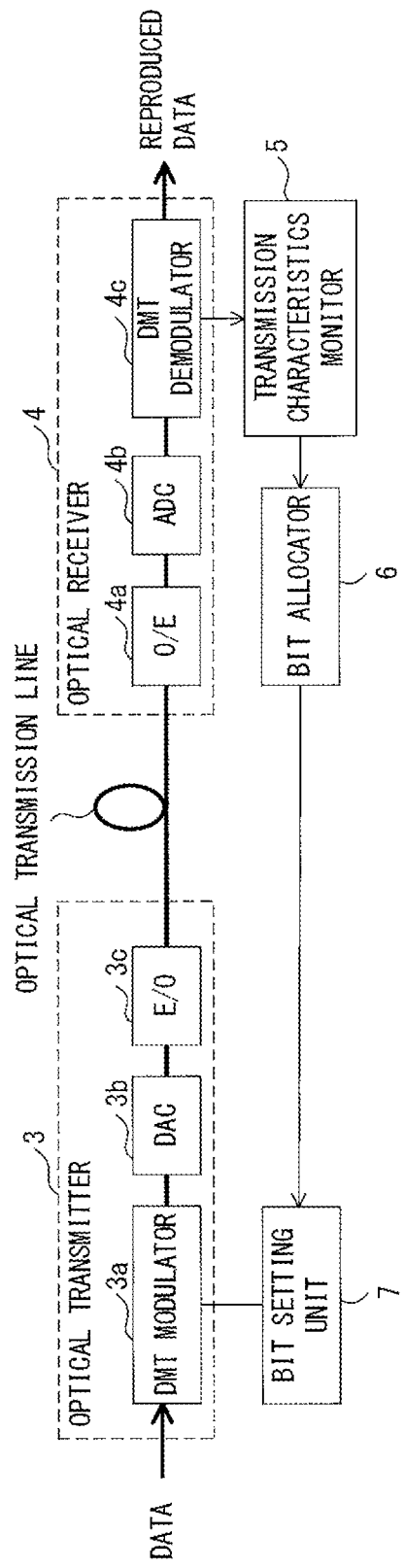
F I G. 2

| LATENCY ($\mu$s) | FEC SCHEME | CODING GAIN | FEC LATENCY |
|---|---|---|---|
| 0~50 | FEC SCHEME 1 (BCH, 906 BITS) | 6.6dB | 8.3ns |
| 50~100 | FEC SCHEME 2 (BCH, 3965 BITS) | 8.4dB | 36.5ns |
| 100~ | FEC SCHEME 3 (CONCATENATED BCH, 38016 BITS) | 11.0dB | 100$\mu$s |

F I G. 6

OPTICAL TRANSMISSION DEVICE AND OPTICAL TRANSMISSION SYSTEM

CROSS-REFERENCE TO RELATED APPLICATION

This application is based upon and claims the benefit of priority of the prior Japanese Patent Application No. 2014-045183, filed on Mar. 7, 2014, the entire contents of which are incorporated herein by reference.

FIELD

The embodiments discussed herein are related to an optical transmission device and an optical transmission system.

BACKGROUND

As one of the technologies for suppressing influence of bit errors in a data transmission system, an error correction code has been widely in practical use. The error correction code is given, for example, at an end of data by a transmitter. A receiver can correct bit errors of received data using the error correction code.

In recent years, various error correction methods have been in practical use. The error correction methods are appropriately selected according to communication environment. As an example, when line quality is low, a method with a high correction capability is selected. Also when a low bit error rate is needed, a method with a high correction capability may be selected.

Note that an error correction control device that performs appropriate error correction control in accordance with change in an error rate is proposed (for example, Japanese Laid-open Patent Publication No. 3-71739). In addition, an error correction scheme for selecting an error correction method in accordance with line quality of a radio transmission path is proposed (for example, Japanese Laid-open Patent Publication No. 9-116486). Further, an error correction control method for preventing or suppressing data interruption at the time of changing error correction modes of a transmission system is proposed (for example, Japanese Laid-open Patent Publication No. 2013-13030).

In order to enhance error correction capability, for example, an error correction code having a long code length is used. In this case, a ratio of the error correction code to actual data increases, and therefore data transmission efficiency may be reduced. In addition, a time needed for an error correction process increases in a receiver, and therefore it may be difficult to provide services requiring high-speed response (e.g., securities transactions or exchange transactions).

SUMMARY

According to an aspect of the embodiments, an optical transmission device includes: an error correction scheme determining unit configured to determine an error correction scheme based on a latency between the optical transmission device and a correspondent device; an error correction encoder configured to generate encoded data by performing an error correction encoding on transmission data using the error correction scheme determined by the error correction scheme determining unit; a modulation format determining unit configured to determine a modulation format based on the error correction scheme determined by the error correction scheme determining unit and transmission characteristics between the optical transmission device and the correspondent device; and an optical transmitter configured to generate a modulated optical signal from the encoded data with the modulation format determined by the modulation format determining unit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2 illustrates an example of an optical transmission system for transmitting data using DMT modulation.

FIG. 6 illustrates an example of an FEC scheme decision table.

DESCRIPTION OF EMBODIMENTS

Figure 1:
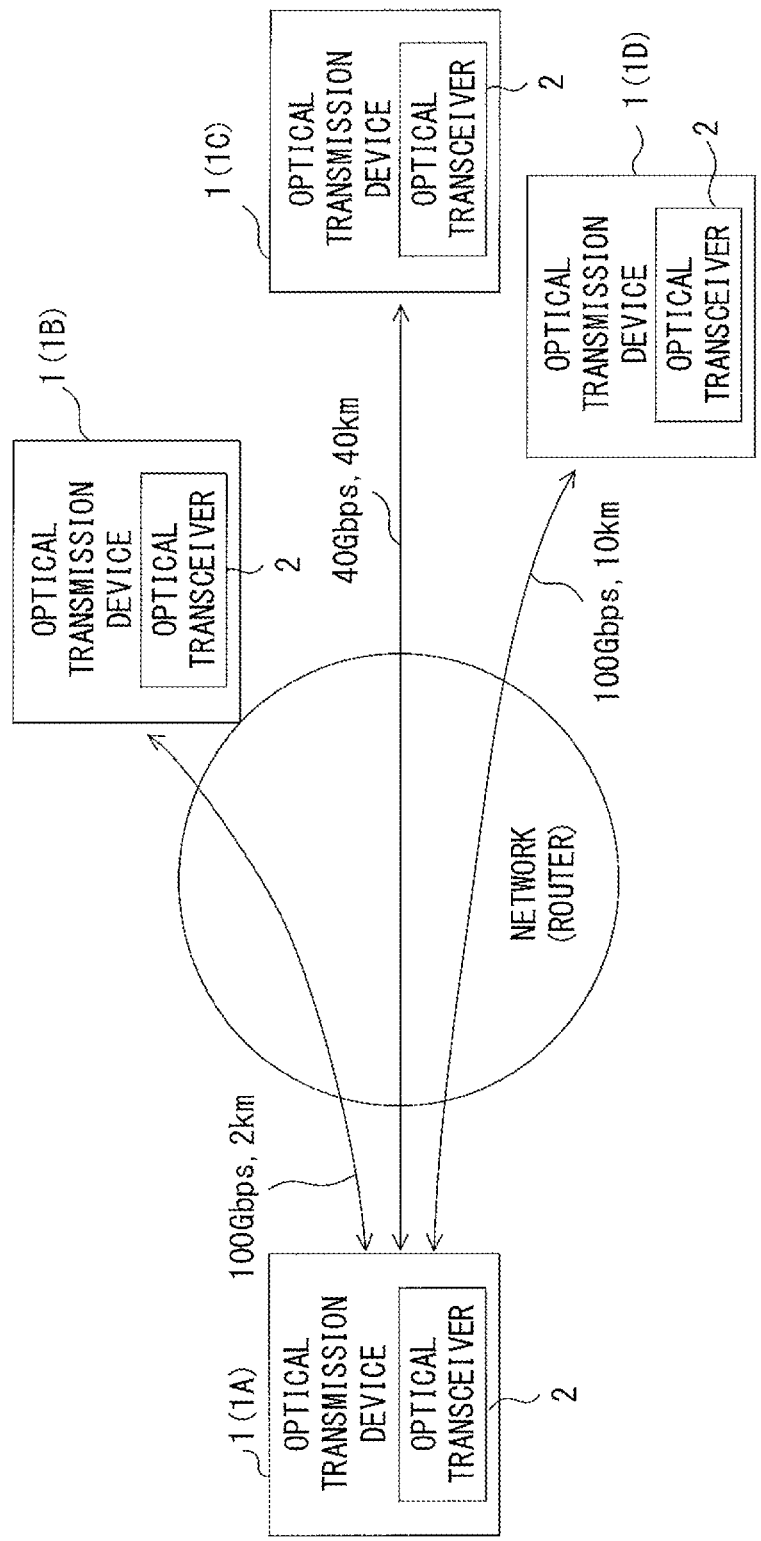
FIG. 1 illustrates an example of an optical network according to an embodiment.

FIG. 1 illustrates an example of an optical network according to an embodiment. As illustrated in FIG. 1, a plurality of optical transmission devices 1 (1A-1D) are connected to the optical network. In addition, the optical network includes, for example, one or a plurality of optical path switches. The optical path switch is, for example, a router device. The optical transmission device 1 is capable of transmitting/receiving data to/from a correspondent device (i.e., another optical transmission device 1).

Each of the optical transmission devices 1 includes an optical transceiver 2. The optical transceiver 2 includes an optical transmitter and an optical receiver. The optical transceiver 2 is capable of generating a modulated optical signal from a data signal and transmitting the modulated optical signal to a destination. The optical transceiver 2 is also capable of demodulating the received modulated optical signal and reproducing the data signal.

The optical network is requested to configure optical paths that have different transmission distances and/or capacities. As an example, it is assumed that the optical transmission device 1A is provided in a data center for the purpose of a cloud service, and that the optical transmission devices 1B-1D are respectively connected to clients. In this case, the optical transmission device 1A is requested to provide optical paths having different transmission distances and different capacities when the respective clients access the data center. Therefore, it is preferable that the optical transceiver 2 be capable of flexibly providing different transmission distances and different capacities. Further, the optical transceiver 2 may be requested to provide large-capacity data transmission over 100 Gbps.

In recent years, Discrete Multi-Tone (DMT) modulation has been studied as one of the technologies for improving data transmission speed. In the description below, the optical transceiver 2 is assumed to transmit and receive data using DMT modulation.

FIG. 2 illustrates an example of an optical transmission system for transmitting data using DMT modulation. Here, it is assumed that DMT modulated optical signal is transmitted from an optical transmitter 3 to an optical receiver 4. The optical transmitter 3 is assumed to be provided in the optical transceiver 2 of the optical transmission device 1 (e.g., the optical transmission device 1A), and the optical receiver 4 is assumed to be provided in the optical transceiver 2 of another optical transmission device 1 (e.g., the optical transmission device 1B).

The optical transmitter 3 includes a DMT modulator 3a, a D/A converter 3b, and an E/O element 3c. The DMT modulator 3a generates a DMT modulated signal from data. The data is divided and allocated to a plurality of subcarriers. Therefore, even when high-speed data is transmitted, the speed of data allocated to each of the subcarriers may be low. Note that frequencies of the plurality of subcarriers are different from each other.

The D/A converter 3b converts the DMT modulated signal generated by the DMT modulator 3a into an analog signal. The E/O element 3c generates a DMT modulated optical signal from the analog DMT modulated signal. The E/O element 3c is realized by, for example, a direct modulation laser component.

Figure 3A:
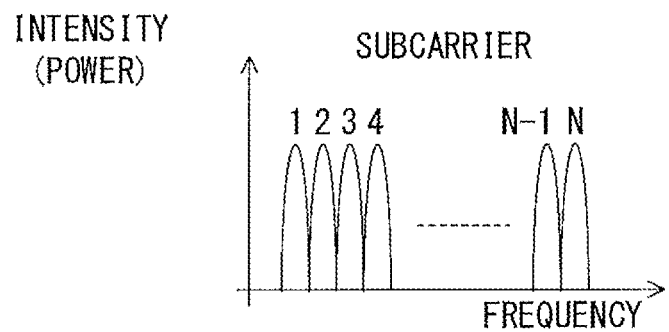
FIGS. 3A-3C illustrate DMT modulation.

FIG. 3A illustrates an example of a spectrum of a DMT modulated optical signal. In this example, in DMT modulation, data is transmitted using N subcarriers 1-N. In addition, optical intensities (or optical powers) of the respective subcarriers are approximately equalized. The DMT modulated optical signal is transmitted via an optical fiber transmission line, and is received by the optical receiver 4.

The optical receiver 4 includes an O/E element 4a, an A/D converter 4b, and a DMT demodulator 4c. The O/E element 4a converts the received DMT modulated optical signal into an electric signal. The O/E element 4a is realized by, for example, a photodiode. The A/D converter 4b converts a signal that is output from the O/E element 4a into a digital signal. The DMT demodulator 4c performs DMT demodulation on the digital signal that is output from the A/D converter 4b, and reproduces data.

In the optical transmission system having the configuration above, data allocation to the respective subcarriers is determined based on transmission characteristics between optical transmission devices. The transmission characteristics are specified by a Signal-to-Noise Ratio (SNR) that is monitored in, for example, an optical transmission device at a destination. In other words, a transmission characteristics monitor 5 monitors the SNR of the DMT modulated optical signal received from the optical transmitter 3. In this case, the transmission characteristics monitor 5 monitors the SNR for each of the subcarriers.

Figure 3B:
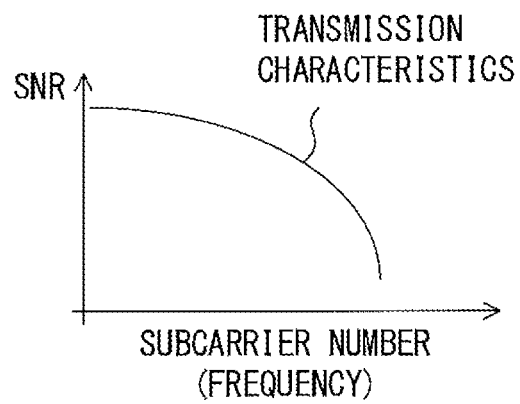

FIG. 3B illustrates an example of transmission characteristics measured by the transmission characteristics monitor 5. The horizontal axis expresses a subcarrier number (1-N) that identifies each of the subcarriers. The vertical axis expresses an SNR. In this example, the transmission characteristics are better in a frequency range having a small subcarrier number, and the transmission characteristics worse in a frequency range having a large subcarrier number.

Figure 3C:
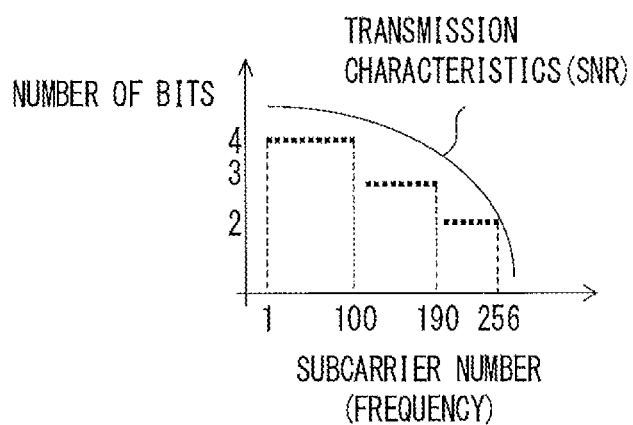

A bit allocator 6 determines bit allocation for the respective subcarriers based on the transmission characteristics measured by the transmission characteristics monitor 5. In other words, the number of bits transmitted by one symbol is determined for the respective subcarriers. Here, the number of bits allocated to a subcarrier having a high SNR is large, and the number of bits allocated to a subcarrier having a low SNR is small. In the example illustrated in FIG. 3C, "4 bits" is allocated to each of the subcarriers 1-100, "3 bits" is allocated to each of the subcarriers 101-190, and "2 bits" is allocated to each of the subcarriers 191-256.

A bit setting unit 7 specifies a modulation format for each of the subcarriers in accordance with the bit allocation determined by the bit allocator 6. As an example, a modulation format equivalent to QPSK is specified for the subcarriers to which "2 bits" is allocated. A modulation format equivalent to 8PSK is specified for the subcarriers to which "3 bits" is allocated. A modulation format equivalent to 16QAM is specified for the subcarriers to which "4 bits" is allocated. Then, the DMT modulator 3a modulates the respective subcarriers with the modulation format specified by the bit setting unit 7.

In the configuration illustrated in FIG. 2, the bit allocator 6 is provided in the receiver side, but the embodiments are not limited to this configuration. In other words, as an example, the bit allocator 6 may be provided in the transmitter side. In this case, measurement results by the transmission characteristics monitor 5 are reported from the receiver side to the transmitter side.

As described above, the optical transmission device according to the embodiment transmits data using DMT modulation. In addition, the optical transmission device 1 can transmit data using an error correction code in order to reduce influence of bit errors.

Figure 4:
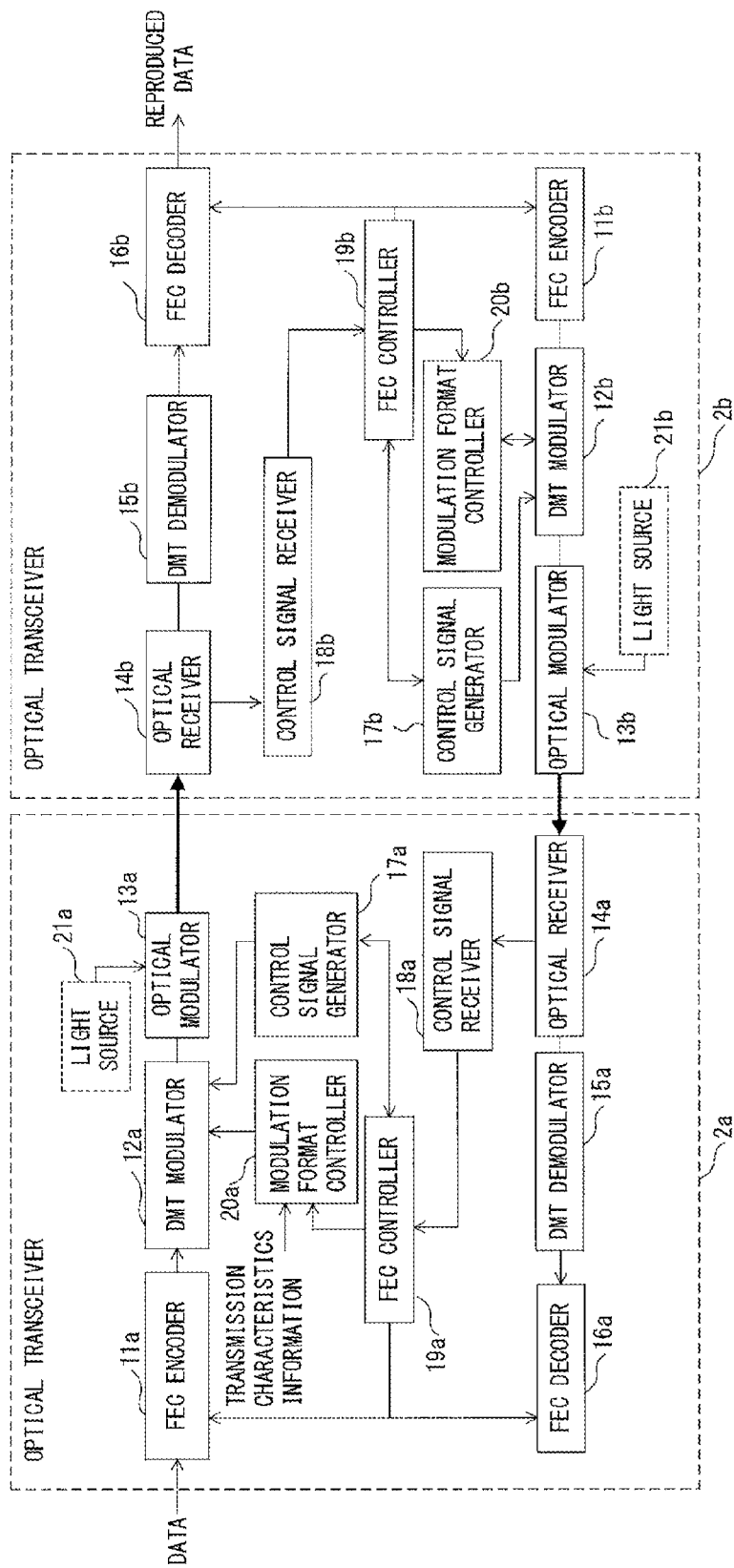
FIG. 4 illustrates an example of a configuration of an optical transceiver according to the embodiment.

FIG. 4 illustrates an example of a configuration of an optical transceiver according to the embodiment. In the description below, a case in which data is transmitted between an optical transceiver 2a and an optical transceiver 2b is described. The optical transceiver 2a is assumed to be provided in an optical transmission device 1 (e.g., the optical transmission device 1A), and the optical transceiver 2b is assumed to be provided in another optical transmission device 1 (e.g., the optical transmission device 1B).

The optical transceiver 2a includes an FEC (Forward Error Correction) encoder 11a, a DMT modulator 12a, an optical modulator 13a, an optical receiver 14a, a DMT demodulator 15a, an FEC decoder 16a, a control signal generator 17a, a control signal receiver 18a, an FEC controller 19a, and a modulation format controller 20a. Similarly, the optical transceiver 2b includes an FEC encoder 11b, a DMT modulator 12b, an optical modulator 13b, an optical receiver 14b, a DMT demodulator 15b, an FEC decoder 16b, a control signal generator 17b, a control signal receiver 18b, an FEC controller 19b, and a modulation format controller 20b. Note that configurations and operations of the optical transceiver 2a and the optical transceiver 2b are substantially the same. Therefore, in the description below, a case in which data is transmitted from the optical transceiver 2a to the optical transceiver 2b is described.

The FEC encoder 11a performs an error correction encoding on a transmission data so as to generate encoded data. In this example, an error correction code is an FCE code. The optical transceivers 2a and 2b respectively support a plurality of FEC schemes. In the description below, each of the optical transceivers 2a and 2b is assumed to support a BCH code (906 bits), a BCH code (3965 bits), and a concatenated BCH code (38016 bits). The FEC encoder 11a generates encoded data from transmission data with an FEC scheme specified by the FEC controller 19a.

The DMT modulator 12a generates a DMT modulated signal from the encoded data generated by the FEC encoder 11a. As described with reference to FIG. 2 to FIG. 3C, the encoded data is divided and allocated to a plurality of subcarriers. Bit allocation to each of the subcarriers is specified by the modulation format controller 20a. In other words, the DMT modulator 12a generates the DMT modulated signal from the encoded data in accordance with a modulation format (in this example, the bit allocation) that is specified by the modulation format controller 20a.

The optical modulator 13a generates a modulated optical signal from the DMT modulated signal generated by the DMT modulator 12a. The optical modulator 13a is realized by, for example, the D/A converter 3b and the E/O element 3c illustrated in FIG. 2. In this case, the optical modulator 13a generates the modulated optical signal from the DMT modulated signal by direct modulation. Alternatively, the optical modulator 13a may generate the modulated optical signal from the DMT modulated signal by external modulation. In this case, the optical transceiver 2a includes a light source 21a that supplies continuous wave light to the optical modulator 13a.

The modulated optical signal generated by the optical transceiver 2a is transmitted via the optical fiber transmission line, and is received by the optical transceiver 2b. The modulated optical signal is guided to the optical receiver 14b in the optical transceiver 2b. The optical receiver 14b converts the received modulated optical signal into an electric signal. Note that the optical receiver 14b is realized by, for example, the O/E element 4a and the A/D converter 4b illustrated in FIG. 2.

The DMT demodulator 15b performs DMT demodulation on an output signal of the optical receiver 14b so as to recover the encoded data. Here, the DMT modulator 12a and the DMT demodulator 15b perform mutually corresponding processes. The FEC decoder 16b performs an FEC process on the encoded data recovered by the DMT demodulator 15b so as to reproduce the transmission data. When a bit error is detected, the FEC decoder 16b corrects the error using the FEC code. Note that the FEC encoder 11a and the FEC decoder 16b perform mutually corresponding processes.

The control signal generator 17a generates a control signal in response to an instruction from the FEC controller 19a or the modulation format controller 20a. As an example, when a latency measurement instruction is given from the FEC controller 19a, the control signal generator 17a generates a probe signal. The probe signal is one of the control signals, and has a specified data pattern. The control signal generated by the control signal generator 17a is transmitted to the optical transceiver 2b using the DMT modulator 12a and the optical modulator 13a.

The control signal receiver 18a receives a control signal generated by the control signal generator 17b of the optical transceiver 2b. Then, the control signal receiver 18a guides the received control signal to the FEC controller 19a.

The FEC controller 19a determines an FEC scheme based on a latency between the optical transceivers 2a and 2b. Then, the FEC controller 19a gives instructions to the FEC encoder 11a and the FEC decoder 16a such that the FEC encoder 11a and the FEC decoder 16a operate according to the determined FEC scheme. As a result, the FEC encoder 11a and the FEC decoder 16a respectively update parameters for the FEC process in accordance with the instructions given from the FEC controller 19a. In addition, the FEC controller 19a reports the determined FEC scheme to the modulation format controller 20a.

The modulation format controller 20a determines a modulation format based on the FEC scheme determined by the FEC controller 19a and transmission characteristics between the optical transceivers 2a and 2b. The transmission characteristics between the optical transceivers 2a and 2b are expressed by the SNR of each of the subcarriers in this example, as described with reference to FIG. 3B. In this case, the SNR of each of the subcarriers is measured in advance or periodically by the transmission characteristics monitor 5 illustrated in FIG. 2. The measurement result is given to the modulation format controller 20a (and 20b) as transmission characteristics information. Note that the determination of the modulation format is realized by bit allocation to each of the subcarriers in this example, as described with reference to FIG. 3C.

The FEC encoder 11 (11a or 11b), the DMT modulator 12 (12a or 12b), the DMT demodulator 15 (15a or 15b), and the FEC decoder 16 (16a or 16b) are not particularly limited, but are realized by, for example, DSP, FPGA or the like. In addition, the control signal generator 17 (17a or 17b), the FEC controller 19 (19a or 19b), and the modulation format controller 20 (20a or 20b) are not particularly limited, but are realized by, for example, a processor system including a processor element and a memory.

A method whereby the optical transceiver 2 determines an FEC scheme and a modulation format based on a latency is described next. As an example, in the optical transmission system illustrated in FIG. 4, the optical transceiver 2a determines an FEC scheme and a modulation format for communication with the optical transceiver 2b.

In the description below, it is assumed that the transmission characteristics between the optical transceivers 2a and 2b (in this example, the SNRs of the respective subcarriers) have been measured in advance and that the measurement result has been given to the FEC controller 19a as transmission characteristics information. It is also assumed that the FEC encoders 11a and 11b and the FEC decoders 16a and 16b are stopped.

The FEC controller 19a first measures a latency between the optical transceivers 2a and 2b. In other words, the FEC controller 19a gives a latency measurement instruction to the control signal generator 17a. At this time, the FEC controller 19a starts a timer for measuring the latency. Alternatively, the FEC controller 19a records a start time of latency measurement.

The control signal generator 17a generates a probe signal for measuring the latency in response to the latency measurement instruction. The probe signal has a specified data pattern. The probe signal is transmitted to the optical transceiver 2b using the DMT modulator 12a and the optical modulator 13a. The probe signal may be transmitted using, for example, a specified subcarrier from among a plurality of subcarriers used in DMT modulation.

The probe signal is extracted by the optical receiver 14b in the optical transceiver 2b, and is guided to the control signal receiver 18b. The control signal receiver 18b guides the received probe signal to the FEC controller 19b. Upon receipt of the probe signal generated in the optical transceiver 2a, the FEC controller 19b gives, to the control signal generator 17b, an instruction to return a feedback signal to the optical transceiver 2a.

The control signal generator 17b generates a feedback signal. The feedback signal also has a specified data pattern. The feedback signal is transmitted to the optical transceiver 2a using the DMT modulator 12b and the optical modulator 13b. The feedback signal may also be transmitted using, for example, a specified subcarrier from among the plurality of subcarriers used in DMT modulation.

The feedback signal is extracted by the optical receiver 14a in the optical transceiver 2a, and is guided to the control signal receiver 18a. The control signal receiver 18a guides the received feedback signal to the FEC controller 19a. Upon receipt of the feedback signal generated by the optical transceiver 2b, the FEC controller 19a measures a latency between the optical transceivers 2a and 2b. The latency is measured using the timer described above. Alternatively, the latency may be calculated from a difference between a latency measurement start time and a feedback signal reception time.

As described above, the FEC controller 19a measures the latency between the optical transceivers 2a and 2b by measuring a time period from when transmitting a probe signal until receiving a corresponding feedback signal. In other words, the FEC controller 19a substantially measures RTT (Round Trip Time). Therefore, ping or a message equivalent to ping may be used in order to measure the latency. Note that the latency measured in this manner does not include an FEC processing time.

In the example above, the optical transceiver 2b returns a feedback signal corresponding to a received probe signal to the optical transceiver 2a, but the optical transceiver 2b may return the received probe signal itself to the optical transceiver 2a. When time synchronization is established between the optical transceiver 2a and the optical transceiver 2b, a time stamp may be given to the probe signal (and the feedback signal). In this case, a latency for the time of transmitting data from the optical transceiver 2a to the optical transceiver 2b, and a latency for the time of transmitting data from the optical transceiver 2b to the optical transceiver 2a can be individually measured. Note that, in this method, the optical transceiver 2b reports, to the optical transceiver 2a, a measurement result of the latency for the time of transmitting data from the optical transceiver 2a to the optical transceiver 2b.

The optical transceiver 2a may perform modulation at a specified speed on a subcarrier, and may measure a latency by monitoring a delay time of a signal after a round trip to the optical transceiver 2b. In this case, the optical transceivers 2a and 2b may use a plurality of subcarriers. When the plurality of subcarriers are used, modulation speed may vary for the respective subcarriers. In addition, the optical transceiver 2a may output a continuous wave light signal of a specified subcarrier, and may measure a latency by monitoring a delay time of the signal after a round trip to the optical transceiver 2b. In this case, the optical transceivers 2a and 2b may use a plurality of subcarriers.

The FEC controller 19a determines an FEC scheme based on the measured latency. A policy in determining the FEC scheme is the following.

Figures 5A, 5B:
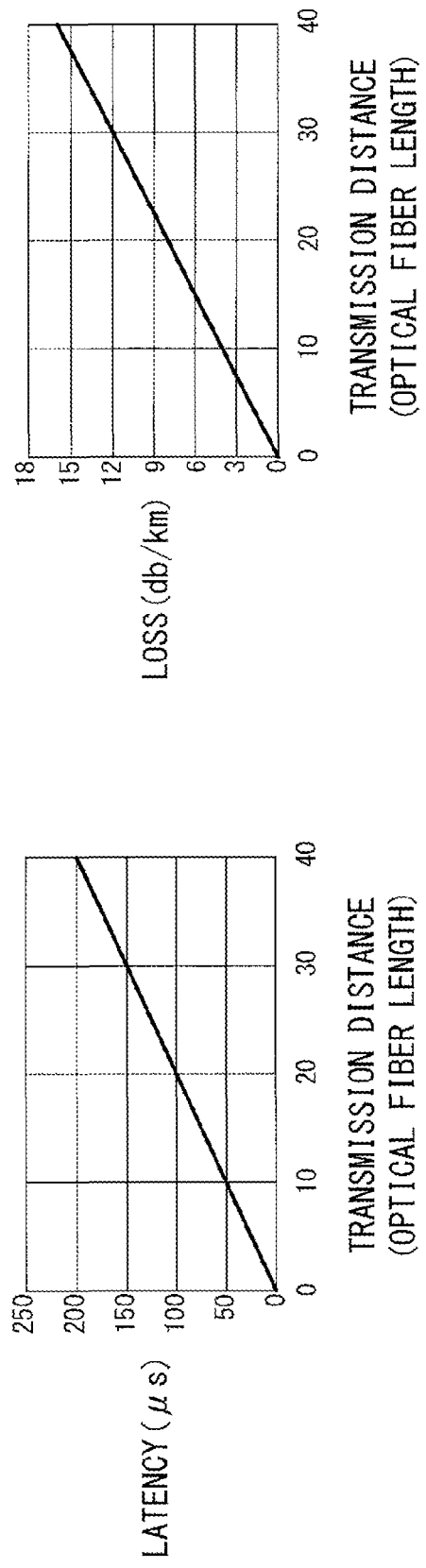
FIGS. 5A and 5B illustrate latency and optical loss with respect to a transmission distance.

A latency depends on a transmission delay between the optical transceivers 2a and 2b and a processing time in an optical transmission device. The transmission delay is substantially proportional to a transmission distance between the optical transceivers 2a and 2b, as illustrated in FIG. 5A. When the transmission distance (i.e., an optical fiber length) becomes longer, an optical loss becomes greater, as illustrated in FIG. 5B. When the optical loss is great, transmission characteristics (e.g., an SNR) deteriorate at a receiver.

Therefore, assuming that the processing time in the optical transmission device is fixed, an optical transmission system having a larger latency is likely to have lower transmission characteristics. In other words, in an optical transmission system having a large latency, a bit error is likely to increase in data transmission.

Therefore, it is preferable that an FEC scheme having a high error correction capability be used in the optical transmission system having a large latency. On the other hand, in an optical transmission system having a small latency, an FEC scheme having a low error correction capability may be used. The "error correction capability" is assumed to correspond to the number of bits for which errors can be corrected.

In actual data transmission, an FEC process is performed on data. Therefore, in the actual data transmission, a latency also depends on a time needed for the FEC process (hereinafter referred to as an "FEC processing time"). Accordingly, when a transmission distance is short, a transmission delay is small, and therefore the FEC processing time is sometimes dominant over the entire latency. In many cases, when an FEC scheme having a high error correction capability is used, a time needed for the FEC process (in particular, a time needed for a process in which an FEC decoder detects and corrects an error) is long, and when an FEC scheme having a low error correction capability is used, the time needed for the FEC process is short. Therefore, application of the FEC scheme having a low error correction capability for an optical transmission system having a short transmission distance is suitable for reducing the entire latency (including not only the transmission delay but also the FEC processing time). As an example, in a system for providing services that requires high-speed response (e.g., securities transactions or exchange transactions), when a transmission distance between a server computer and a client is short, it is preferable to select the FEC scheme having a low error correction capability in order to realize high-speed response.

FIG. 6 illustrates an example of an FEC scheme decision table. In the FEC scheme decision table, FEC schemes to be used for respective latencies (here, not including the FEC processing time) have been registered, as illustrated in FIG. 6. In this example, the optical transceivers support three FEC schemes. It has been registered that FEC scheme 1 (BCH code (906 bits)) is used when the latency is smaller than 50μ seconds, that FEC scheme 2 (BCH code (3965 bits)) is used when the latency is 50-100μ seconds, and that FEC scheme 3 (concatenated BCH code (38016 bits)) is used when the latency is greater than 100μ seconds. Note that the FEC scheme decision table is provided in, for example, the FEC controller 19a.

Error correction capabilities of the respective FEC schemes are expressed by coding gains. From among the three FEC schemes in this example, a coding gain of FEC scheme 3 is the greatest, and a coding gain of FEC scheme 1 is the smallest. The coding gain expresses a difference in transmission characteristics (e.g., an SNR) between a signal on which FEC encoding is not performed and a signal on which FEC encoding is performed. As an example, when an SNR of a signal encoded by FEC scheme 1 is smaller than that of a signal on which FEC encoding is not performed by 6.6 dB, the same error rate is obtained. In other words, improvement of the transmission characteristics that substantially corresponds to "6.6 dB" is realized by performing encoding by FEC scheme 1.

An FEC latency (here, a time needed for the FEC process) depends on error correction capability. In other words, an FEC latency of FEC scheme 1 with a low error correction capability is small, and an FEC latency of FEC scheme 1 with a low error correction capability is large.

Therefore, the FEC controller 19a selects an FEC scheme to be used by referring to the FEC scheme decision table illustrated in FIG. 6 in accordance with the measured latency. In other words, when a latency between the optical transceivers 2a and 2b is smaller than 50µ seconds, the FEC controller 19a selects FEC scheme 1. When the latency is between 50-100µ seconds, the FEC controller 19a selects FEC scheme 2. When the latency is larger than 100µ seconds, the FEC controller 19a selects FEC scheme 3.

The FEC controller 19a gives instructions to the FEC encoder 11a and the FEC decoder 16a such that the FEC encoder 11a and the FEC decoder 16a operate with the selected FEC scheme. Then, the FEC encoder 11a and the FEC decoder 16a respectively update parameters for the FEC process in accordance with the instructions from the FEC controller 19a. In addition, the FEC controller 19a reports the selected FEC scheme to the optical transceiver 2b. As a result, in the optical transceiver 2b, the FEC encoder 11b and the FEC decoder 16b respectively update parameters for the FEC process similarly to the FEC encoder 11a and the FEC decoder 16a. Further, the FEC controller 19a reports the selected FEC scheme to the modulation format controller 20a.

The modulation format controller 20a determines a modulation format based on the FEC scheme selected by the FEC controller 19a and the transmission characteristics between the optical transceivers 2a and 2b. The transmission characteristics between the optical transceivers 2a and 2b, that have been measured in advance in this example, are expressed by an SNR of each of the subcarriers. Transmission characteristics information indicating the SNR of each of the subcarriers is given to the modulation format controller 20a.

Determination of a modulation format is realized by bit allocation to each of the subcarriers, as described above. In this example, the number of bits allocated to subcarrier i (i=1 to 256) is assumed to be determined according to the policy described below. Note that SNRi indicates an SNR that is measured for subcarrier i. In addition, following condition is satisfied.

"threshold value 1<threshold value 2<threshold value 3"

Note that threshold value 1, threshold value 2, and threshold value 3 are assumed to be appropriately determined based on simulation or measurement.
(1) When SNRi<threshold 1, the number of bits=0.
(2) When threshold 1≤SNRi<threshold 2, the number of bits=2.
(3) When threshold 2≤SNRi<threshold 3, the number of bits=3.
(4) When threshold 3≤SNRi, the number of bits=4.

Note that the optical transmission device 1 according to the embodiment corrects bit errors using FEC code. By using the FEC code, an effect that is equivalent to the effect acquired when the transmission characteristics (here, the SNR) are improved by a coding gain of the FEC scheme is substantially acquired. Therefore, the modulation format controller 20a determines bit allocation in accordance with the FEC scheme selected by the FEC controller 19a.

As an example, when the measured latency is smaller than 50µ seconds and FEC scheme 1 is selected, the modulation format controller 20a determines the number of bits allocated to subcarrier i according to the policy described below.
(1) When SNRi+6.6<threshold 1, the number of bits=0.
(2) When threshold 1≤SNRi+6.6<threshold 2, the number of bits=2.
(3) When threshold 2≤SNRi+6.6<threshold 3, the number of bits=3.
(4) When threshold 3≤SNRi+6.6, the number of bits=4.

When the measured latency is within a range of 50-100µ seconds and FEC scheme 2 is selected, the modulation format controller 20a determines the number of bits allocated to subcarrier i according to the policy described below.
(1) When SNRi+8.4<threshold 1, the number of bits=0.
(2) When threshold 1≤SNRi+8.4<threshold 2, the number of bits=2.
(3) When threshold 2≤SNRi+8.4<threshold 3, the number of bits=3.
(4) When threshold 3≤SNRi+8.4, the number of bits=4.

When the measured latency is larger than 100µ seconds and FEC scheme 3 is selected, the modulation format controller 20a determines the number of bits allocated to subcarrier i according to the policy described below.
(1) When SNRi+11<threshold 1, the number of bits=0.
(2) When threshold 1≤SNRi+11<threshold 2, the number of bits=2.
(3) When threshold 2≤SNRi+11<threshold 3, the number of bits=3.
(4) When threshold 3≤SNRi+11, the number of bits=4.

The modulation format controller 20a specifies a modulation format for each of the subcarriers in accordance with the bit allocation above. As an example, QPSK or a modulation format equivalent to QPSK is specified for subcarriers to which "2 bits" is allocated. 8PSK or a modulation format equivalent to 8PSK is specified for subcarriers to which "3 bits" is allocated. 16QAM or a modulation format equivalent to 16QAM is specified for subcarriers to which "4 bits" is allocated. The DMT modulator 12a updates a parameter of a modulation circuit so as to modulate the respective subcarriers by the modulation format specified by the modulation format controller 20a. In addition, the DMT demodulator 15a updates a parameter of a demodulation circuit so as to demodulate the respective subcarriers by the modulation format specified by the modulation format controller 20a.

Further, the modulation format controller 20a reports the determined modulation format to the optical transceiver 2b. Then, the DMT modulator 12b also updates the parameter of the modulation circuit so as to modulate the respective subcarriers by the modulation format specified by the modulation format controller 20a. The DMT demodulator 15b also updates the parameter of the demodulation circuit so as to demodulate the respective subcarriers by the modulation format specified by the modulation format controller 20a.

Figure 7A:
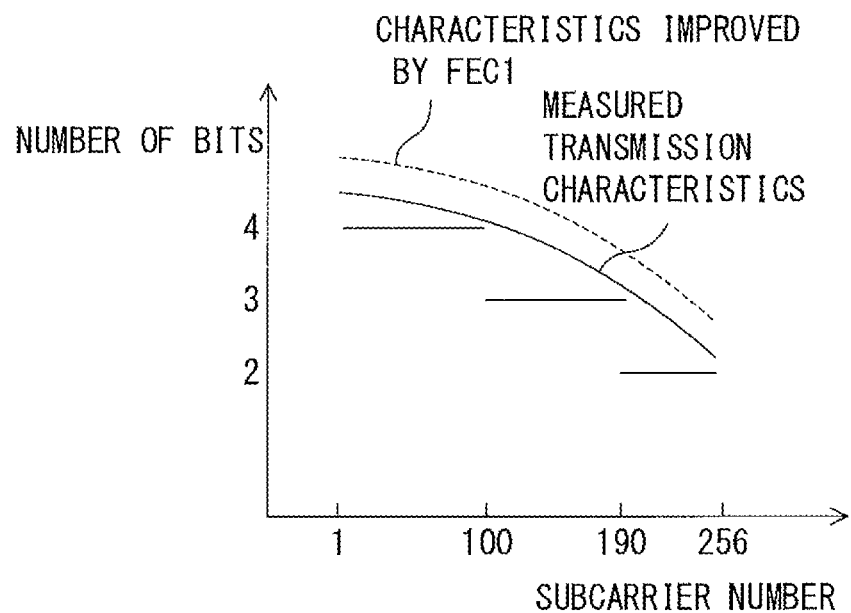
FIGS. 7A and 7B illustrate an example of determining an FEC scheme and a modulation format for a small latency.
Figure 7B:
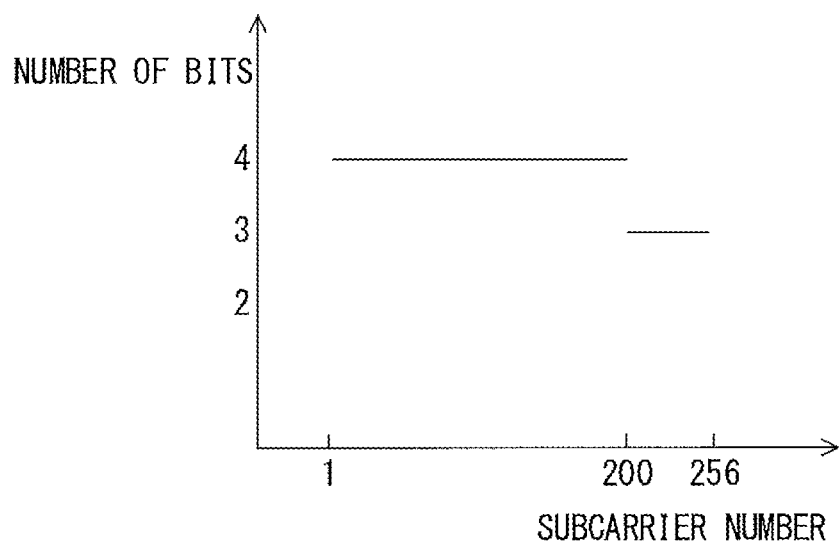

FIGS. 7A and 7B illustrate an example of a method for determining an FEC scheme and a modulation format for a small latency. Here, it is assumed that the transmission characteristics illustrated in FIG. 7A have been obtained by measurement. When determination using threshold value 1 to threshold value 3 described above is performed on the transmission characteristics, the bit allocation illustrated in FIG. 7A is assumed to be obtained.

When the latency is small (less than 50µ seconds in the example illustrated in FIG. 6), the FEC controller 19a selects FEC scheme 1. The modulation format controller 20a calculates characteristics that are obtained by improving the measured transmission characteristics by a coding gain of FEC scheme 1 (6.6 dB in the example illustrated in FIG. 6). The characteristics improved by FEC scheme 1 is expressed by a broken line in FIG. 7A. Then, the modulation format controller 20a determines the bit allocation using threshold value 1 to threshold value 3 described above on the improved characteristics. As a result, bit allocation illustrated in FIG. 7B is obtained. Therefore, the DMT modulator 12a performs DMT modulation in accordance with the bit allocation.

Figure 8A:
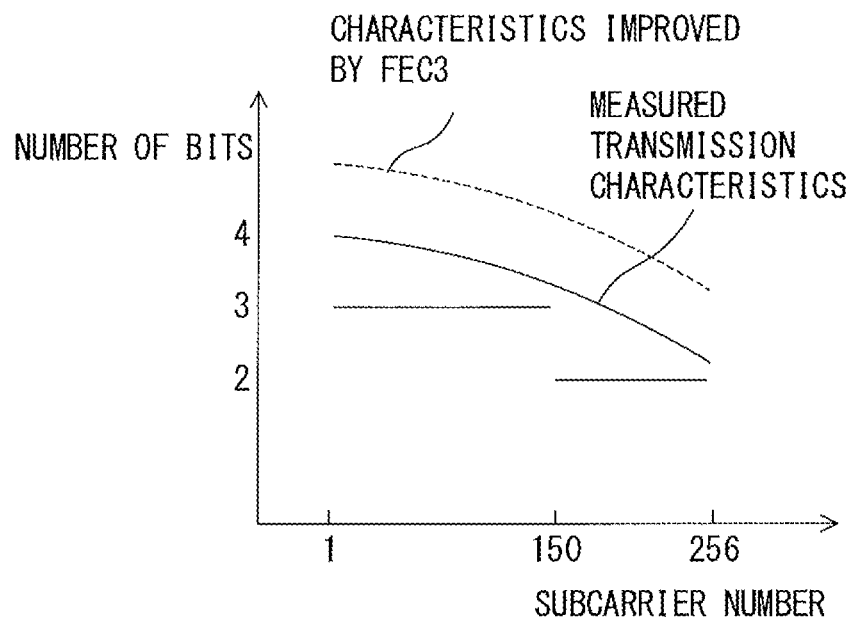
FIGS. 8A and 8B illustrate an example of determining an FEC scheme and a modulation format for a large latency.
Figure 8B:
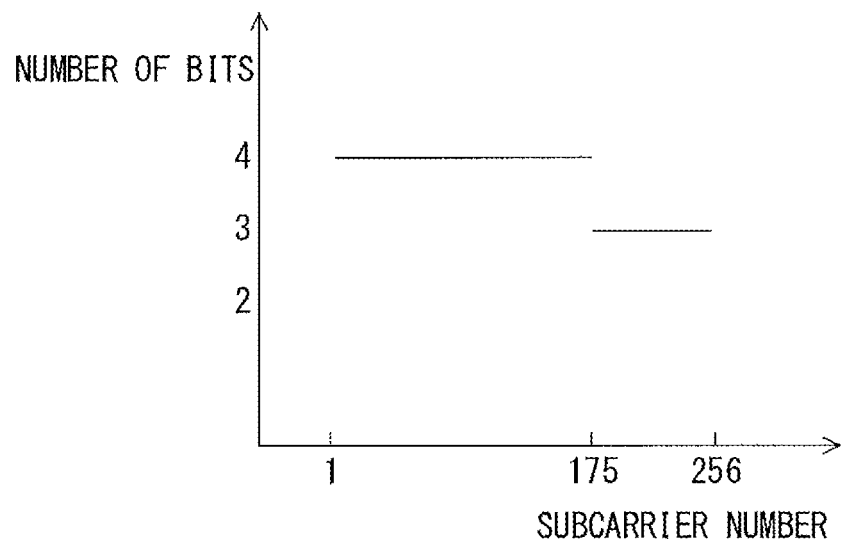

FIGS. 8A and 8B illustrates an example of a method for determining an FEC scheme and a modulation format for a large latency. Here, it is assumed that the transmission characteristics illustrated in FIG. 8A have been obtained by measurement. When determination using threshold value 1 to threshold value 3 described above is performed on the transmission characteristics, the bit allocation illustrated in FIG. 8A is assumed to be obtained. As illustrated in FIG. 7A and FIG. 8A, comparing with a case in which the latency is small, when the latency is large, the transmission characteristics deteriorate, and therefore the number of bits per one symbol is reduced.

When the latency is large (more than 100µ seconds in the example illustrated in FIG. 6), the FEC controller 19a selects FEC scheme 3. The modulation format controller 20a calculates characteristics that is obtained by improving the measured transmission characteristics by a coding gain of FEC scheme 3 (11.0 dB in the example illustrated in FIG. 6). The characteristics improved by FEC scheme 3 are expressed by a broken line in FIG. 8A. As illustrated in FIG. 7A and FIG. 8A, comparing with a case in which the latency is small, when the latency is large, a coding gain of the selected FEC scheme is greater. The modulation format controller 20a determines the bit allocation using threshold value 1 to threshold value 3 described above on the improved characteristics. As a result, the bit allocation illustrated in FIG. 8B is obtained. Therefore, the DMT modulator 12a performs DMT modulation in accordance with the bit allocation.

Figure 9:
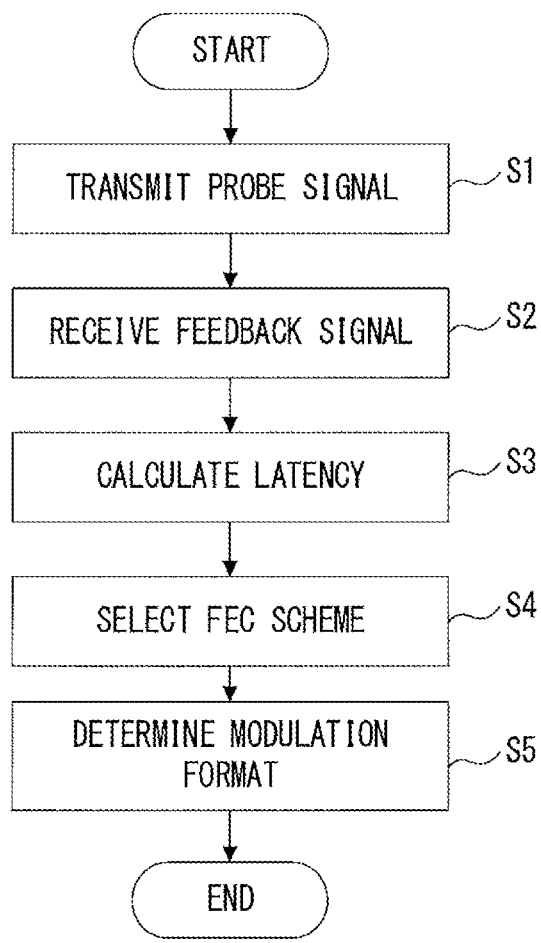
FIG. 9 is a flowchart illustrating a process of determining an FEC scheme and a modulation format.

FIG. 9 is a flowchart illustrating a process of determining an FEC scheme and a modulation format. In the description below, procedure in which the optical transceiver 2a illustrated in FIG. 4 determines an FEC scheme and a modulation format. It is assumed that an FEC encoder and an FEC decoder are stopped when the process in this flowchart is performed.

In S1, the FEC controller 19a transmits a probe signal to the optical transceiver 2b using the control signal generator 17a. Upon receipt of the probe signal, the optical transceiver 2b is assumed to return a corresponding feedback signal to the optical transceiver 2a. In S2, the FEC controller 19a receives the feedback signal returning from the optical transceiver 2b via the control signal receiver 18a. In S3, the FEC controller 19a calculates a latency between the optical transceivers 2a and 2b based on a time at which the probe signal was transmitted and a time at which the feedback signal is received. Note that the latency does not include an FEC processing time.

In S4, the FEC controller 19a determines an FEC scheme based on the calculated latency. As an example, the FEC controller 19a refers to the FEC scheme decision table illustrated in FIG. 6, and selects an FEC scheme corresponding to the calculated latency from among a plurality of FEC schemes that have been prepared in advance. In S5, the modulation format controller 20a determines a modulation format for data transmission between the optical transceivers 2a and 2b based on the transmission characteristics between the optical transceivers 2a and 2b and the FEC scheme determined in S4. As an example, when data is transmitted using DMT modulation, the modulation format controller 20a determines bit allocation for respective subcarriers.

As described above, in the optical transmission system according to the embodiment, an FEC scheme is selected based on a latency between optical transmission devices, and a modulation format is determined based on transmission characteristics between the optical transmission devices and the selected FEC scheme. Therefore, in an optical transmission path having a small latency, a processing times in the optical transmission device can be reduced by selecting an FEC scheme having a low error correction capability. This allows providing services requiring high-speed response in actual data transmission using FEC code. On the other hand, in an optical transmission path having a large latency, influence of bit errors is suppressed by selecting an FEC scheme having a high error correction capability. Accordingly, data can be transmitted using a modulation format in which the number of bits per one symbol is large, and efficiency in data transmission is improved. For example, in an optical transmission system for transmitting data using DMT modulation, frequency utilization efficiency is improved.

In the example above, BDH code is used for error correction code, but the embodiments are not limited to this method. Namely, other FEC codes (e.g., Hamming codes, Reed-Solomon codes, Golay codes, convolutional codes or the like) may be used instead of BCH code.

In addition, in the example above, a latency between the optical transceivers 2a and 2b is measured using a probe signal (and a feedback signal). Then, the FEC controller determines an FEC scheme based on the latency measured as described above. However, the embodiments are not limited to this method. Other methods for determining an FEC scheme will be descried below.

Figure 10:
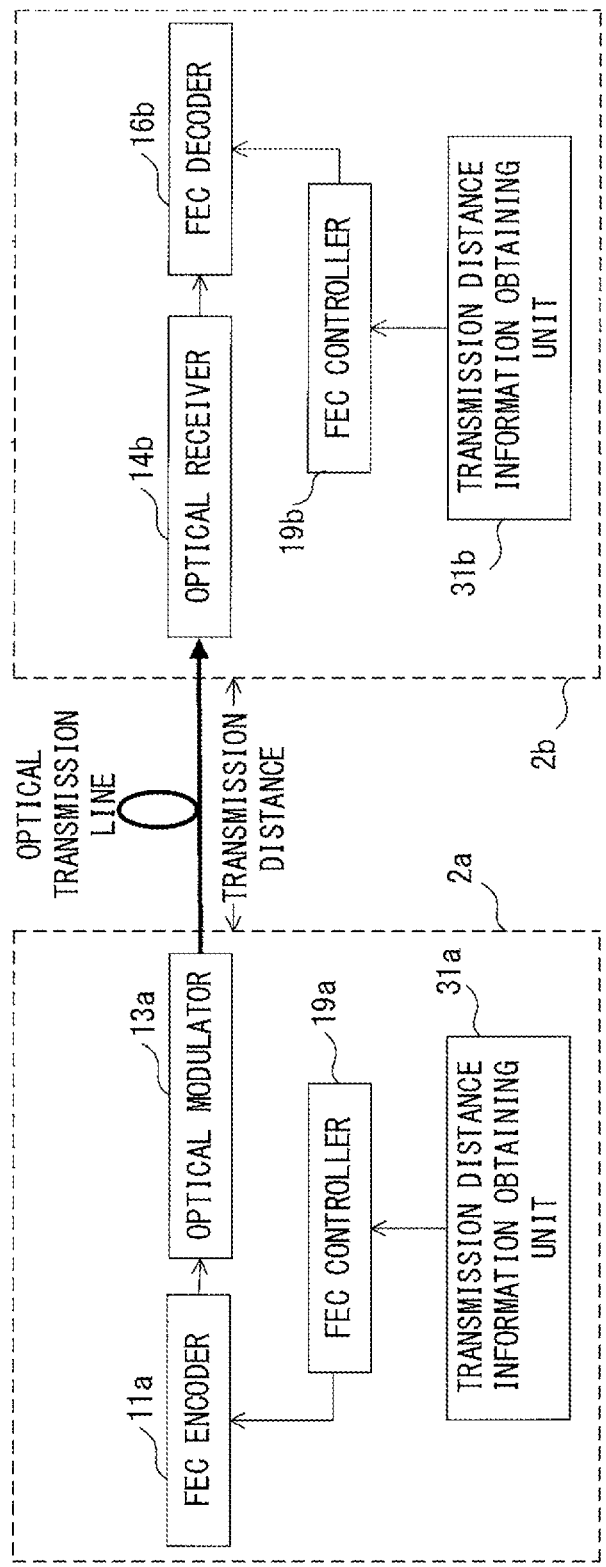
FIG. 10 illustrates a method for determining an FEC scheme according to a transmission distance.

FIG. 10 illustrates a method for determining an FEC scheme according to a transmission distance. Note that functions other than determining an FEC scheme are omitted in FIG. 10.

When the FEC scheme is determined based on the transmission distance, the optical transceivers 2a and 2b respectively include transmission distance information obtaining units 31a and 31b. The transmission distance information obtaining units 31a and 31b respectively obtain transmission distance information indicating a transmission distance between the optical transceivers 2a and 2b. It is assumed that the transmission distance between the optical transceivers 2a and 2b have been measured in advance.

The FEC controller 19a estimates a latency between the optical transceivers 2a and 2b from the transmission distance information obtained by the transmission distance information obtaining unit 31a, and determines an FEC scheme based on the latency. Then, the FEC controller 19a updates setting of the FEC encoder 11a in accordance with the determined FEC scheme. Similarly, the FEC controller 19b estimates a latency between the optical transceivers 2a and 2b from the transmission distance information obtained by the transmission distance information obtaining unit 31b, and determines an FEC scheme based on the latency. Then, the FEC controller 19b updates setting of the FEC decoder 16b in accordance with the determined FEC scheme.

As described above, the FEC controller estimates a latency from a transmission distance, and determines an FEC scheme based on the latency. However, the FEC controller may determine an FEC scheme based on the transmission distance without estimating the latency.

Figure 11:
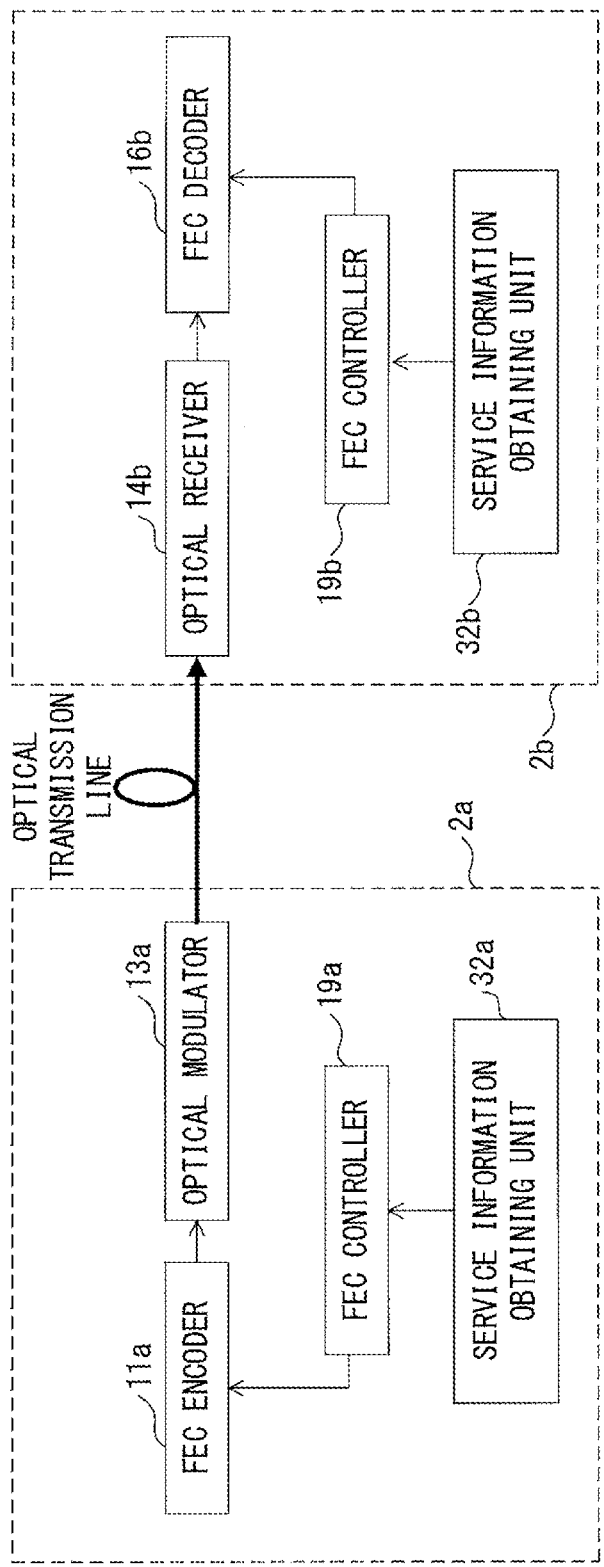
FIG. 11 illustrates a method for determining an FEC scheme according to a service type.

FIG. 11 illustrates a method for determining an FEC scheme according to a service type. Note that functions other than determining the FEC scheme omitted in FIG. 11.

In this embodiment, a service means a network service that is provided using an optical transmission system. As an example, in a securities transactions service, order data is transmitted from a client to a server computer, and transaction data returns from the server computer to the client. In a graphics development service, graphical data is transmitted between cites.

High-speed response is requested depending on the service type. In other words, an allowable latency varies according to the service type. Therefore, when an FEC scheme is determined based on the service type, the optical transceivers 2a and 2b respectively include service information obtaining units 32a and 32b. The service information obtaining units 32a and 32b respectively obtain service information that identifies the type of a service that is provided using an optical transmission system. Then, the service information obtaining units 32a and 32b respectively estimate allowable latencies from the obtained service information.

The FEC controller 19a determines an FEC scheme based on the allowable latency obtained by the service information obtaining unit 32a. Then, the FEC controller 19a updates setting of the FEC encoder 11a in accordance with the determined FEC scheme. Similarly, the FEC controller 19b determines an FEC scheme based on the allowable latency obtained by the service information obtaining unit 32b. Then, the FEC controller 19b updates setting of the FEC decoder 16b in accordance with the determined FEC scheme.

As described above, the FEC controller estimates an allowable latency from a service type, and determines an FEC scheme based on the allowable latency. However, the FEC controller may determine an FEC scheme based on the service type without estimating the allowable latency.

Figure 12:
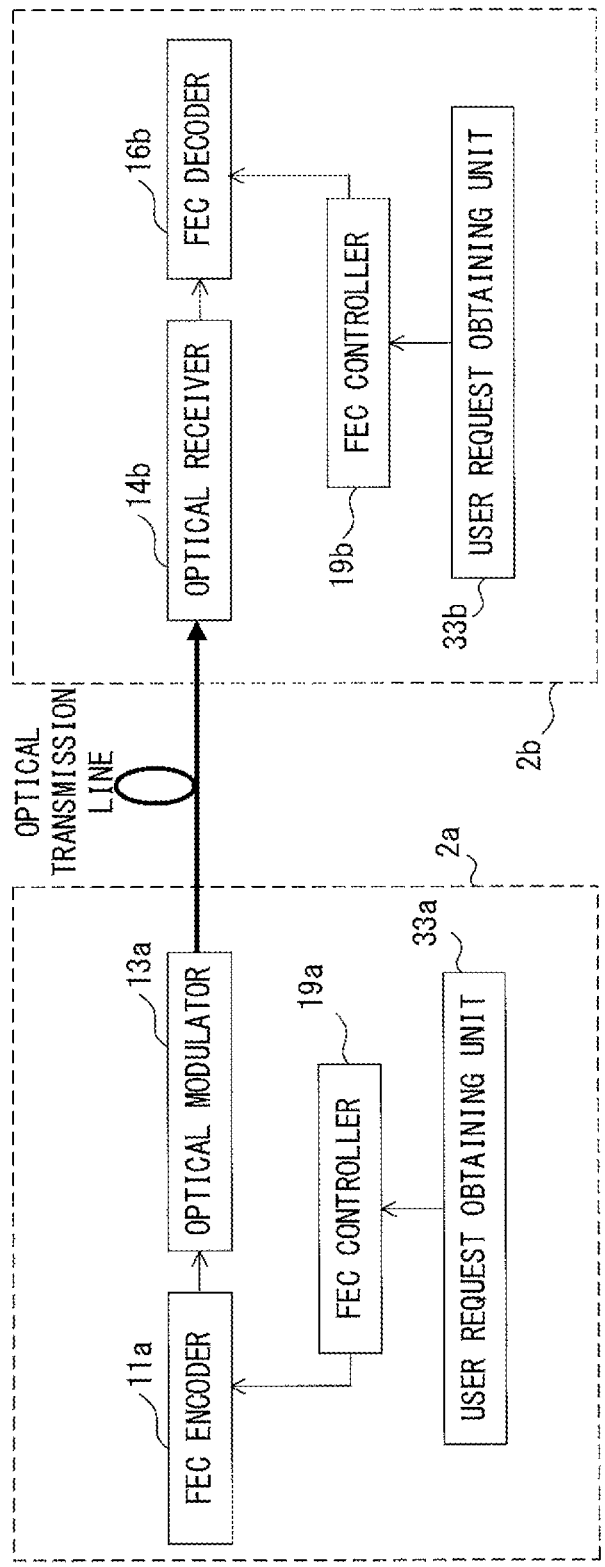
FIG. 12 illustrates a method for determining an FEC scheme according to a user's request.

FIG. 12 illustrates a method for determining an FEC scheme according to a user's request. Note that functions other than determining the FEC scheme are omitted in FIG. 12.

A user (here, including a network administrator) may specify a maximum latency. In other words, an allowable latency may be requested from the user. When an FEC scheme is determined based on the user's request, the optical transceivers 2a and 2b respectively include user request obtaining units 33a and 33. The user request obtaining units 33a and 33b respectively obtain allowable latencies given from the user.

The FEC controller 19a determines an FEC scheme based on the allowable latency obtained by the user request obtaining unit 33a. Then, the FEC controller 19a updates setting of the FEC encoder 11a in accordance with the determined FEC scheme. Similarly, the FEC controller 19b determined an FEC scheme based on the allowable latency obtained by the user request obtaining unit 33b. Then, the FEC controller 19b updates setting of the FEC decoder 16b in accordance with the determined FEC scheme.

In the specification, the optical transmission device and the optical transmission system are described with respect to DMT modulation. However, the present invention may be used for other modulation format, for example, NRZ, PAM4, QPSK, 16QAM and so on. Furthermore, a person skilled in the art may change the bitrate for FEC overhead by changing clock frequency of an optical transceiver.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. An optical transmission device comprising:
an error correction scheme determining unit configured to determine an error correction scheme based on a latency between the optical transmission device and a correspondent device;
an error correction encoder configured to generate encoded data by performing an error correction encoding on transmission data using the error correction scheme determined by the error correction scheme determining unit;
a modulation format determining unit configured to determine a modulation format based on the error correction scheme determined by the error correction scheme determining unit and transmission characteristics between the optical transmission device and the correspondent device;
a modulator configured to generate a modulated signal from the encoded data with the modulation format determined by the modulation format determining unit; and
an optical modulator configure to generate a modulated optical signal from the modulated signal.

2. The optical transmission device according to claim 1, wherein
the modulation format determining unit determines the modulation format based on a coding gain of the error correction scheme determined by the error correction scheme determining unit and the transmission characteristics between the optical transmission device and the correspondent device.

3. The optical transmission device according to claim 2, wherein
the modulation format determining unit determines the modulation format based on transmission characteristics obtained by improving the transmission characteristics between the optical transmission device and the correspondent device by the coding gain.

4. The optical transmission device according to claim 1, further comprising:
a latency measuring unit configured to measure the latency between the optical transmission device and the correspondent device, wherein
the error correction scheme determining unit determines the error correction scheme based on the latency measured by the latency measuring unit.

5. The optical transmission device according to claim 4, wherein
the latency measuring unit measures the latency based on a time period from when a probe signal is transmitted to the correspondent device until when a signal corresponding to the probe signal is received from the correspondent device.

6. The optical transmission device according to claim 1, wherein
the error correction scheme determining unit estimates the latency between the optical transmission device and the correspondent device based on a transmission distance between the optical transmission device and the correspondent device, and determines the error correction scheme based on the latency.

7. The optical transmission device according to claim 1, wherein
the error correction scheme determining unit estimates an allowable latency for a specified service type, and determines the error correction scheme based the allowable latency.

8. The optical transmission device according to claim 1, wherein
the error correction scheme determining unit determines the error correction scheme based on a latency requested from a user.

9. An optical transmission device configured to transmit data to a correspondent device using discrete multi-tone modulation that uses a plurality of subcarriers, the optical transmission device comprising:
an error correction scheme determining unit configured to determine an error correction scheme based on a latency between the optical transmission device and the correspondent device;
an error correction encoder configured to generate encoded data by performing an error correction encoding on transmission data using the error correction scheme determined by the error correction scheme determining unit;
a discrete multi-tone modulator configured to generate a discrete multi-tone modulated signal from the encoded data with the discrete multi-tone modulation in accordance with bit allocation to the plurality of subcarriers that is determined based on transmission characteristics between the optical transmission device and the correspondent device and the error correction scheme determined by the error correction scheme determining unit; and
an optical modulator configured to generate a modulated optical signal from the discrete multi-tone modulated signal generated by the discrete multi-tone modulator.

10. An optical transmission system comprising:
a first optical transmission device; and
a second optical transmission device, wherein
the first optical transmission device includes:
an error correction scheme determining unit configured to determine an error correction scheme based on a latency between the first optical transmission device and the second optical transmission device;
an error correction encoder configured to generate encoded data by performing an error correction encoding on transmission data using the error correction scheme determined by the error correction scheme determining unit;
a modulation format determining unit configured to determine a modulation format based on the error correction scheme determined by the error correction scheme determining unit and transmission characteristics between the first optical transmission device and the second optical transmission device;
a modulator configured to generate a modulated signal from the encoded data with the modulation format determined by the modulation format determining unit; and
an optical modulator configure to generate a modulated optical signal from the modulated signal.

* * * * *